United States Patent [19]

Greene

[11] 4,059,825

[45] Nov. 22, 1977

[54] BURST/SLIP CORRECTION DECODER AND METHOD

[76] Inventor: Edward P. Greene, 19 Lakeside Drive, Greenbelt, Md. 20770

[21] Appl. No.: 731,837

[22] Filed: Oct. 12, 1976

[51] Int. Cl.$^2$ .............................................. G06F 11/12
[52] U.S. Cl. .................. 340/146.1 D; 340/146.1 AL
[58] Field of Search ................ 340/146.1 D, 146.1 AL

[56] References Cited

U.S. PATENT DOCUMENTS

| | | | |
|---|---|---|---|
| 3,550,082 | 12/1970 | Tong | 340/146.1 D |
| 3,571,794 | 3/1971 | Tong | 340/146.1 D |
| 3,938,086 | 2/1976 | Valbonesi | 340/146.1 D |
| 3,961,311 | 6/1976 | Pavoni et al. | 340/146.1 D |

Primary Examiner—Charles E. Atkinson
Attorney, Agent, or Firm—Edmund M. Jaskiewicz

[57] ABSTRACT

A shortened cyclic block decoder and a method of decoding encoded cyclic blocks of data of the type $(n,k)$ are described. The invention can correct burst errors of either a synchronous or asynchronous variety imbedded within the received block where the total adjusted error burst length is $b$ and the number of bit slippages of either an insertion or deletion variety contained within the error burst is $d$, such that $d < D \leq B < n-k$ and $E \geq n+D$; where B and D are independent design parameters of the device, E is the exponent of the code's generating polynomial, $n$ is the block length, and $k$ is the number of information bits, $n > k$.

10 Claims, 10 Drawing Figures

*FIG. 1*

TABLE 2

TABLE 3 — NUMERICAL EXAMPLE OF BURST/SLIP DECODING

BURST/SLIP CORRECTION DECODER AND METHOD

FIELD OF THE INVENTION

This invention relates to the field of error correction of transmitted data encoded by shortened cyclic block codes and more particularly relates to apparatus and a method of decoding cyclic block codes of data that have been subjected to burst errors having insertion, deletion, and inversion errors.

DESCRIPTION OF THE PRIOR ART

Cyclic block codes or shortened cyclic block codes of the type $(n, k)$ are widely used to detect and/or correct information transmitted over communications channels. By definition, the code has $k$ leading information bits followed by $(n-k)$ parity check bits forming an $n$-bit codeword. A code is cyclic if $n = E$, the exponent of the code's generating polynomial, P(X), where E is defined to be the smallest positive integer such that $X^E + 1$ is divisible by P(X). The parity check bits are formed such that the polynomial representation of the entire $n$-bit codeword is exactly divisible by P(X).

It is well known that most communications channels are subject to burst error conditions wherein a very high noise level may persist for a period that is long with respect to a bit transmission period and, under these circumstances, many nearby bits are likely to be unreliably detected. It is also well known that burst trapping procedures can be used in conjunction with cyclic or shortened cyclic block codes to correct burst errors within certain well-defined constraints. A $b$-length burst error is a sequence of $b$ consecutive digits in which, at least, the first and last digit are in error and wherein the intermediate digits may or may not be in error. This type of burst trapping decoder is discussed in S. Lin, *An Introduction to Error Correcting Codes*, Prentice-Hall, 1970, as well as other standard coding theory texts. The method essentially consists of iteratively translating the error syndrome down to successively lower order positions. If the error burst length, $b$, is less than the number of parity check bits, $(n-k)$, then when the syndrome is regressed to the point where the translated error burst occupies the low order $b$-bits of the block, the leading $n$-$k$-$b$ bits of the syndrome register will be zero and thus the burst error can be detected. Simple gating circuits permit the error to be corrected by modulo 2 adding the output from the error syndrome register to output of the data register. This type of decoder operates in a Last-In-First-Out (LIFO) mode and the decoded data is outputted in the reverse order from that received. A second reversal is therefore necessary to restore the data to its original order which results in additional decoder delay, prevents concurrent processing of a second data block before the first data block is completely decoded, and requires additional storage elements and logic.

Modern synchronous communication systems rely almost universally on the principle that an oscillator within the receiver is maintained locked in phase and frequency to an oscillator in the transmitter. Phased Locked Loops and other techniques are generally employed to ensure that synchronization is maintained. However, during periods in which burst error conditions prevail, the Phased Locked Loop is deprived of a reliable corrective feedback signal and the master receiver clock may drift with respect to the transmitting clock. In such cases the receiver can make bit decisions at a rate that may be somewhat different from the rate at which the bits were transmitted. This can result in either more bit decisions (i.e., bits inserted) or less bit decisions (bits deleted) than is proper.

All known burst trapping techniques such as are described in Lin (op. cit.) and elsewhere are unable to correct bit slippages resulting from bits either inserted or deleted within the received block. Several patents disclose the aforementioned well known prior art techniques of error correction. All of these patents may be found in Class 340, subclass 146.1. These patents include The Tong patents, U.S. Pat. Nos. 3,571,794 and 3,588,819; Davis et al 3,562,711; Clark 3,568,148; Mitchell 3,577,186; Eastman 3,622,984; Hsiao et al 3,656,107; Blair et al 3,725,859; Howell 3,801,955; Allen 3,805,232; Trafton 3,831,143; Patel 3,851,306; Boudreau et al 3,872,430; and Barrett et al 3,896,416. Many of the foregoing references do not deal with cyclic block codes. Since each encoding technique requires unique error correcting techniques specific to the encoding techniques, those patents dealing with other error coding techniques are not deemed to be relevant. For this reason, it is believed that the patents to Trafton, Blair et al, Clark, and the U.S. Pat. No. 3,571,794 Tong are distinguishable.

The Davis et al patent and the Mitchell patent both disclose electronic components that are also used in the present application but are not relevant since they do not disclose systems for detecting and correcting data having error bursts. None of the remaining references disclose systems for correcting bit slippages.

Because it is believed to be constructive in distinguishing the prior art, the U.S. Pat. No. 3,571,794 Tong will be described in greater detail. This patent is for an automatic synchronization recovery for data systems utilizing burst error correction cyclic codes and treats the problem of correcting synchronization errors or bit slippages when the entire slippage occurs prior to the start of the block being decoded. Therefore, the entire received block is subjected to the same displacement error. By modulo 2 adding a special non-zero modulus $(X^{E-1} + 1)$ to the codeword prior to transmission and again modulo 2 adding the same modulus to the received block prior to the syndrome generation, the two operations will cancel each other in the absence of any synchronization error. The two operations will not be self cancelling, however, in the event of a synchronization error and will give rise to a syndrome pattern indicative of zeros occuring on both ends of the block. The decoder then interprets this condition as a synchronization error and proceeds to correct the error by making a corrective displacement of the entire received block.

Although self-synchronization or comma-free codes have been developed which require no externally supplied information to correctly identify the beginning and end of each codeword when a series of codewords are contiguously transmitted, most communication systems are implemented such that a special packet synchronization code is periodically inserted into the transmitted bit stream for the purpose of providing primary framing of the transmitted codewords. This is particularly important in the case of cyclic block codes which, because of the code's structure, have extremely poor self-synchronization capability. This problem is discussed in greater detail in Bennet and Davey, *Data Transmission*, McGraw Hill, (1965) at pp. 297-299.

SUMMARY OF THE INVENTION

Because of the subject of asynchronous error bursts have not been treated in any of the known prior art, for the purposes of this application, the terms "asynchronous error burst length" and "slip length" are defined as follows. Let $\hat{C} = \hat{c}_{n-1}, \hat{c}_{n-2}, \ldots, \hat{c}_1, \hat{c}_0$ be a transmitted codeword of an (n, k) code and let $C = c_{n-1}, c_{n-2,1} \ldots c_1, c_0$ be the $n'$-bit block received in response to $\hat{C}$ where $n'$ is not necessarily equal to $n$. If $\hat{C} = C$, the block has been received without error and the asynchronous error burst length and the slip length are zero. If on the other hand, C does not equal $\hat{C}$, the asynchronous error burst length and the slip length are computed for the purposes of definition as follows. Assuming that the transmitted codeword is known by some independent means, the corresponding bits of both C and $\hat{C}$ are compared starting at the high order end until a disagreement is found. Let $j_h$ be the number of bit-parts searched prior to finding this disagreement. Now the comparison is repeated starting at the low order end of both C and $\hat{C}$ until a disagreement is found. Let $j_L$ be the number of bit-pairs searched prior to finding this disagreement. The asynchronous error burst length ($b$) of $\hat{C}$ is defined as follows $$b \leq \text{Max}(n \text{ or } n') - (j_H + j_L)$$

The slip length ($d$) is defined as the difference between $n'$ and $n$. For the purposes of the present application, the convention will be utilized such that $d = n' - n$. By this definition, the slip length is positive if a bit insertion or insertions have occurred and is negative if a bit deletion or deletions have occurred, and is zero if no bit slippage has occurred.

It is an object of this invention to correct received data blocks originally encoded into shortened $(n,k)$ cyclic block codewords that have been corrupted with a noise phenomena such that the asynchronous error burst length is b-bits and the slip length is d-bits provided that $b \leq B$. In addition, the absolute value of $d \leq D$ and $n + D \leq E$ where B and D are independent design parameters of the invention subject to the constraints that $D \leq B < n - k$ and where E is the exponent of the code. The bit slippage, if present, need not be contiguous and can be scattered arbitrarily throughout the error burst and include the two end positions of the error burst. In addition to bit slippage errors, any or all of the bits received within the error burst can be subjected to an inverson error (i.e, a "0" changed to a "1" or vice versa).

Another object of one preferred embodiment of the present invention is to decode the received data in an First-In-First-Out mode thereby: (1) resulting in the decoded bits being outputted in the same order as received, and (2) permitting the output phase to begin essentially immediately after the last bit of the block has been received and thereby minimize decoder delay.

It is a further object of this invention to permit the decoding of contiguous data blocks separated only by a packet synchronization code and to provide the capability for the nearly continuous input of received blocks and the concurrent output of decoded blocks using a storage array as small as $(n + 2D)$ bits for the buffering of both the incoming and outgoing blocks, where n and D are as previously defined.

It is a feature of this invention that externally supply synchronization is utilized to locate both the beginning and end of the encoded block. The decoder is thus provided with a count of the actual number of bits ($n'$) received in each block which when compared with the expected number ($n$) of bits facilitates an efficient and systematic search for an asynchronous error burst with a known slip length.

In a presently preferred embodiment, a decoder is disclosed for decoding identifiable blocks of data encoded in a shortened cyclic block code. The decoder comprises a control assembly for receiving encoded data subjected to an error producing environment and for outputting decoded data, a counter for counting the bits in each block of received data, a main data register for storing the received data and a first input syndrome register for generating a syndrome in response to the received data. An exclusive OR gate is connected to an output of the main data register for computing the modulo 2 sum of one bit of the stored received data with a second bit of the received data and is connected at its output to the syndrome register such that the sum is inputted at a particular location in the syndrome register. Outputs from the main data register and the syndrome register are fed to a decoded bit selector which in turn outputs the decoded data.

The method according to the present invention is for use in a machine implemented process usable in a data communication system having decoding apparatus for decoding on a First-In-First-Out basis $n$ data characters that are encoded in a shortened cyclic block code of the type $(n, k)$ where the received data characters have been subjected to an error inducing environment such that the data can contain a burst error of $b$ characters having a slippage error of $d$ characters. The process comprises the steps of counting the number $n'$ of received characters and determining the slip error $d$; storing the received $n'$ characters in a first register; generating and storing an initial syndrome in a second register, said initial syndrome being computed using the generating polynomial and the received data characters and generating an intermediate syndrome from the generated initial syndrome. The intermediate syndrome is generated by rotating and feeding back pursuant to the syndrome generating polynomial the characters stored in the second register $E - n'$ times. Parts of the received $n'$ characters stored in the first register are selectively combined and the combination is combined with a selected character of the generated intermediate syndrome to generate further characters. The process can now test the generated further characters to determine if the received data characters have undergone a burst error and/or can output the decoded characters. A summary of the specific operation of a preferred embodiment of a decoder in accordance with the present invention will now be set forth. After a decoder according to the present invention has been cleared, it will wait until it is signalled that a packet synchronization code signalling the start of a received block has been detected. Thereafter, the received block is transferred bit by bit through an input interface, the data bit being inputted into a main data register (R-register) and a previously cleared input syndrome register (S'-register). In addition, a previously cleared input counter (A-counter) is incremented as each bit is received. This process continues until the decoder detects that another packet synchronization code is present, thereby indicating that the received block has been completely inputted. At this stage, the received block is right-adjusted in the R-register; the S'-register contains the initial error syndrome of the block; and the A-counter contains the bit count of the block. A control assembly portion of the decoder, functionally divided into an input process stage and a decode and output process stage, has been waiting in the input process stage until the block has been inputted. The input process stage now sets a Q flag which is detected by the decode and output process stage of the control assembly and signals that a block is ready for normalization. Responding to the setting of the Q flag, the decode and output process stage will transfer the contents of the S'register to the S-register, transfer the block count ($n'$) from the A-counter to a second, A'-counter, and normalize the R-register and S-register as subsequently described.

The normalization phase is complete at this point and the decode and output process stage will clear a lock out flag, LOUT, which has been previously set and has been inhibiting the input of the next received block. At this point the output phase begins. If a received block is ready, it will now be transferred into the decoder as described above as a result of the operation of the input process stage of the control assembly. Thus, a new data block will be concurrently loaded as the previously loaded block is being processed in the output phase. The R-register and the S-register will be cycled a multiplicity of times under control of an output counter assembly. At each cycle, the output control assembly generates a decoded bit and an output syndrome assembly examines the S-register, a Y flag being set if a correctable pattern is detected. If the Y flag is set, the decode and output process stage will clock out an $n$-bit block; otherwise $n'$-bits are outputted. In addition, if the Y flag has been set, the $n$-bit decoded block is guaranteed to be a valid codeword although there can never be a guarantee that it is identical to the transmitted codeword.

Other features and advantages of the present invention will be discussed in or apparent from the description of the preferred embodiments of the invention found hereinbelow.

BRIEF DESCRIPTION OF THE DRAWINGS

Table II is a diagram illustrating operation of a decoder of an (21,10) shortened cyclic block code according to the present invention.

Table III is a diagram of a transmitted encoded block and the resulting received block that has been subjected to an error burst containing both bit insertions and a bit inversion.

DESCRIPTION OF THE PREFERRED EMBODIMENT

Figure 1:
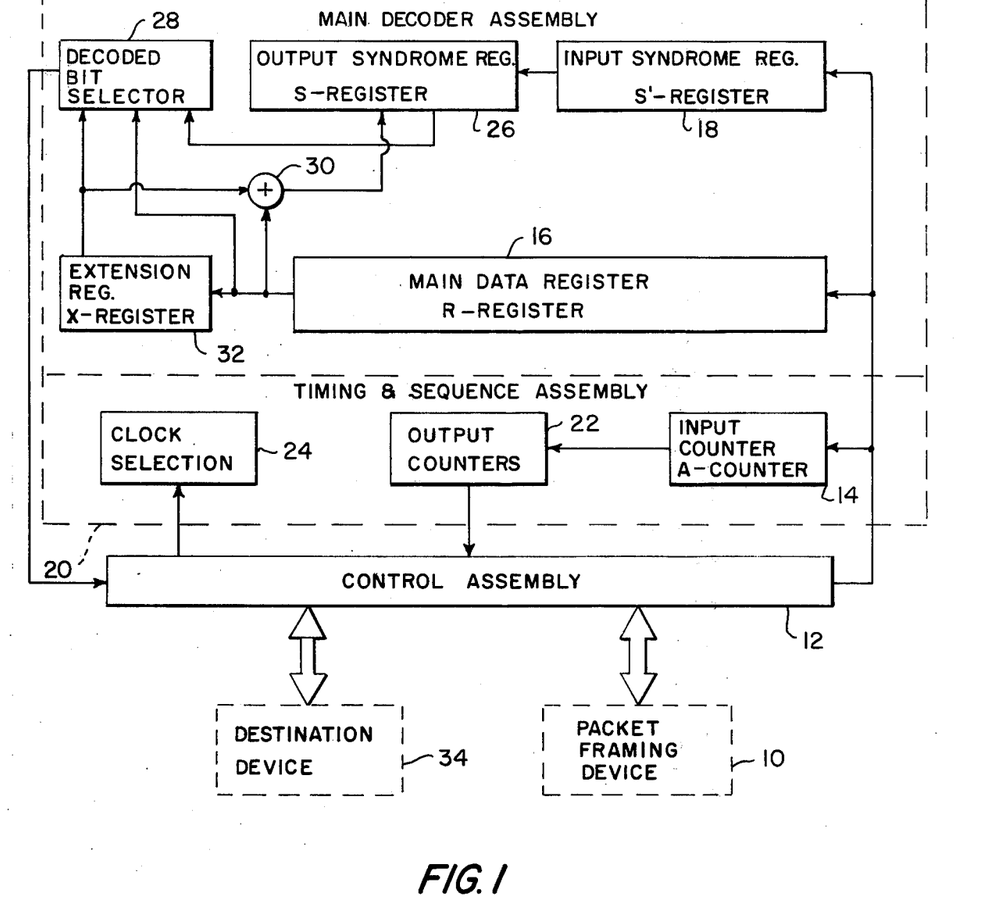
FIG. 1 is a schematic block circuit diagram of apparatus for decoding received data blocks encoded in an ($n-k$) shortened cyclic block code.

With reference to the figures wherein like numerals depict like elements in the several figures, a burst/slip correction decoder is disclosed. With reference in particular to FIG. 1, a block diagram of the invention is depicted. A transmitted signal is sent in a serial stream of data that is generally divided into two sections, a data message section or received data block encoded into a shortened cyclic block code and which is preceded and followed by a packet synchronization code. The transmitted signal is received and sent to a packet framing device (not a part of the present invention and well known in the art) denoted 10 in FIG. 1. Packet framing device 10 detects the packet synchronization code part of the transmitted signal and generates a request to send signal, RTS, to the control assembly 12, which is described hereinbelow. If the control assembly determines that it is ready to receive the data, a Clear-To-Send signal, CTS, is sent back to packet framing device 10. Upon receiving the CTS signal, packet framing device 10 outputs clock signals, DD, and the received data block signals denoted RECBIT. The received data block is outputted one bit at a time to an input counter or A-counter 14, to a main data register or R-register 16, and an input syndrome register or S'-register 18. At the completion of sending the data message section, packet framing device 10 drops the RTS signal thereby signifying that the received data message section or received block has been completed. As soon as the control assembly 12 detects the dropping of the RTS signal, control assembly 12 in turn will drop the CTS signal.

The A-counter is disclosed in FIG. 5 and will be described hereinbelow. The R-register comprises in the preferred embodiment an E-stage shift register where E is the exponent of the cyclic code generating polynomial described hereinabove. The S'-register in the preferred embodiment comprises an $n-k$ stage feedback shift register, where $n-k$ equal the number of parity bits in the data message section of the transmitted signal and $n$ and $k$ represent the block length and number of information bits as defined herinabove.

At this point, the received block is right-adjusted in the R-register, the S'-register contains the initial error syndrome of the block, and the A-counter contains the bit count of the received block.

Figure 3:
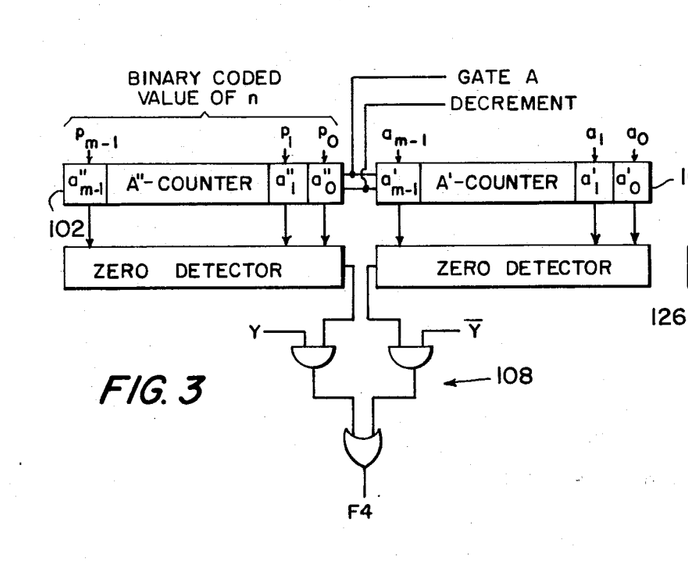
FIG. 3 is a circuit diagram of the output counter which results in the setting of the F4 flag to indicate that the output process is complete.

A-counter 14 is located in a timing and sequencing assembly 20 which also contains output counters 22, shown in greater detail in FIG. 3 and described hereinbelow, and a clock section 24, shown in greater detail in FIG. 4 and described in greater detail hereinbelow. Output counters 22 inform control assembly 12 of the number of decoded bits to output for a given received block. Clock section 24 receives control signals from control assembly 12 and selects either an internal clock or the clock signal generated by packet framing device 10.

Serially coupled to S'-register 18 is an output syndrome register or S-register 26. S-register 26 is generally the same type of register as S'-register but, as explained hereinbelow, is connected differently. The output of S-register is sent to a decoded bit selector 28. Decoded bit selector 28 makes the logical decision as to the proper state of the decoded output bit. The output from the R-register is sent through an Exclusive Or gate 30, sometimes hereinbelow referred to as the G-gate, and to an extension register or X-register 32. X-register is a D stage shift register that is logically configured to be a d stage shift register where D is the maximum correctable slip error and d is the slip error in the received data block as defined hereinabove. The output from the X-register is sent to decoded bit selector 24 whose output in turn is sent to control assembly 12.

The principal purpose of S'-register 18 is to generate an initial error syndrome $S_I$ from the received data block and to transfer $S_I$ to S-register 26. A subsequent utilization of S'-register 18 is to generate timing signals needed during the initialization phase described hereinbelow. Upon the of the initialization phase, and before the completion of the decoding of the received data block, S'-register 18 is ready to begin receiving and generating an initial error syndrome for the next received data block.

The Main Decoder Assembly is indicated at 35, also shown in greater detail in FIG. 2, will be discussed hereinbelow.

Control assembly 12 outputs the decoded data block as a plurality of bits referred to as DBIT. In addition, control assembly 12 can output a clocked pulse, referred to as CLK, an output enabled signal referred to as DOUT, a code word received signal SZ which indicates in the NOT mode that the received data block was correct as received and that no correction was performed. If the decoder attempts to make a correction to the received data block, a correction attempted signal, referred to as the Y flag, can also be transmitted to destination device 34. If the received data block has a slip length $\geq 0$, a slip length $\geq 0$ signal, referred to as the Z flag, is transmitted to destination device 34. If the absolute value of the slip length is greater than the designed feature of the decoder, i.e., is greater than D, then a signal referred to as the H flag is transmitted to destination device 34. Finally, the absolute value of the slip length is sent to the destination device 34 as a $t_i$ signal wherein i represents the actual absolute value of the slip length.

The aforementioned control signals are summarized in Table I.

In the preferred embodiment, the function of the Control Assembly can be performed by any one of a number of commercially available general purpose digital computers, such as microcomputers based on the INTEL 8080, Motorola 6800, or National Semiconductor PACE central processing unit integrated circuit chips. The programming for the Conrol Assembly is discussed hereinbelow. Naturally, it is also possible to implement the control functions by custom designed logic, as is well known in the art.

TABLE I

| | |
|---|---|
| A | binary counter of number of bits in received block |
| A' | decrementing binary counter of number of bits in received block |
| A" | decrementing binary counter of nominal number of bits in received block |
| $a_i$ | i-bit component of A-counter |
| $a'_i$ | i-bit component of A'-counter |
| $a''_i$ | i-bit component of A"-counter |
| b | actual burst error length with received block |
| B | maximum correctable burst error length |
| C | transmitted n-bit codeword |
| $\hat{C}$ | received data block (n'-bits) |
| C* | decoded output block |

TABLE I-continued

| | |
|---|---|
| $c_i$ | i-th bit component of C ($0 \leq i \leq n - 1$) |
| $\hat{c}_i$ | i-th bit component of $\hat{C}$ ($0 \leq i \leq n' - 1$) |
| CLK | master clock signal |
| CTS | Clear-To-Send signal |
| d | actual slip length |
| D | maximum correctable slip length |
| DBIT | decoded output bit |
| DD | input clock signal |
| DOP | decode and output process |
| DOUT | decoder output gate enable signal |
| E | exponent to which the generating polynomial belongs |
| E(x) | error vector |
| $e_i$ | i-th bit component of error vector |
| F1 | input phase flag |
| F2 | initialization phase flag |
| F3 | end test flag |
| F4 | output complete flag |
| FIFO | First-In-First-Out |
| G | syndrome adjustment signal for slippage error compensation |
| $g_i$ | gating vector for insertion error control |
| H | excessive slip flag $\|$slip length$\| > 0$ D |
| i | general index parameter |
| IP | Input Process |
| j | the lowest order position of the received code that contains an error |
| k | number of information bits in encoded block |
| LIFO | Last-In-First-Out |
| LOUT | Input inhibit flag |
| m | number of stages in A, A' and A" counter where $m \geq \log_2(n + D + 1)$ |
| MC | Master Clear |
| n | expected number of bits in encoded block |
| n' | received number of bits in encoded block |
| $P_i$ | binary representation of n |
| $P_f$ | false correction probability |
| P(X) | generating polynomial |
| Q | input block present flag |
| R(i) | remainder function of $X^i$ |
| R-register | main data register |
| RECBIT | input bit received from packet framing device |
| RTS | Request-To-Send signal generated by packet framing device |
| S-register | output syndrome register |
| S'-register | input syndrome register |
| $S_I$ | Initial error syndrome |
| $S_O$ | Normalized error syndrome |
| SV | Zero detector flag from S'-register (flag set if least significant n-k-l stages of S'-register are zero) |
| SX | Timing control signal |
| SY | Inhibit detection flag |
| SZ | zero syndrome flag |
| $t_i$ | A gating signal which is set if $\|$slip width$\| = i$ |
| X | Variable for polynomial representation of code |
| X-register | Extension register |
| Y | Correction flag |
| Z | Insertion flag, equal 1 if n' > n, otherwise equals 0. |

Before proceeding further with the detailed description of the invention, it is necessary to develop some of the theory underlying the invention. Let us first consider the case in which an asynchronous error burst of length b ($b \leq B$) has occurred and that the slip length is d where $0 < d \leq D$. As previously stated the inserted bits may be arbitrarily scattered throughout the b-bit error burst; however, it can be arbitrarily presumed that the inserted bits occurred contiguously at the high order end of the block since the decoding algorithm will make the proper correction to compensate for any error in the above presumption. Let C be the transmitted codeword of a shortened (n,k) cyclic block code whose generating polynomial belongs to the exponent E such that $E \geq n + D$. The optimum configuration is $E = n + D$. Let j be the lowest order position of the received block that is adversely affected by the error burst. The received block designated $\hat{C}$ has the form $$\hat{C} = C_{n-1}, C_{n-2}, \ldots, C_{j+B-d}, \quad n - j - B + d \text{ terms} \quad (1$$
$$(C_{j+B-1} + e_{j+B-1}), \ldots, (C_j + e_j), \quad B \text{ terms}$$

-continued

| | |
|---|---|
| $C_{j-1}, C_{j-2}, \ldots, C_1, C_0$ | j terms |
| | n + d terms | where $e_i = c_i \oplus \hat{c}_i$ represents the burst error terms. Throughout the application, the symbols $\oplus$ and $\Sigma$ represent the Exclusive Or and the Modulo 2 Summation Processes respectively. Expressed in polynomial form it is:

$$\hat{C}(x) = \sum_{i=j+B}^{n+d-1} c_{i-d} X^i \oplus \sum_{i=j}^{j+B-1} (c_i \oplus e_i) X^i \oplus \sum_{i=0}^{j-1} C_i X^i \quad (2)$$

The Error Vector, $E(x)$, is defined by $$E(x) = c(x) \oplus \hat{c}(x) \quad (3)$$

Thus, $$E(x) = \sum_{i=n}^{n+d-1} c_{i-d} X^i \oplus \sum_{i=j+B}^{n-1} (c_i \oplus c_{i-d}) X^i \oplus \sum_{i=j}^{j+B-1} e_i X^i \quad (4)$$

$R(i)$ is defined such that $R(i)$ is the remainder obtained when $x^i$ is divided by the code's generating polynomial, $P(X)$, using modulo 2 arithmetic. Since cyclic and shortened cyclic block codes are known to be linear, the error syndrome resulting from the decoding of $\hat{C}$ may be expressed as $$S_I = \sum_{i=n}^{n+d-1} c_{i-d} R(i) \oplus \sum_{i=j+B}^{n-1} (c_i \oplus c_{i-d}) R(i) \oplus \sum_{i=j}^{j+B-1} e_i R(i) \quad (5)$$

The S-register 26 initially containing $S_I$ is now initialized as follows to produce a normalized syndrome $S_o$. First S-register is cycled B times and the order of the remainder function is increased by B. Thus $$S_i = \sum_{i=m}^{n+d-1} c_{i-d} R(i+B) \oplus \sum_{i=j+B}^{n-1} (c_i \oplus c_{i-d}) R(i+B) \oplus \sum_{i=j}^{j+B-1} e_i R(i+B) \quad (6)$$

$\hat{C}$ is now left adjusted in R-register 16 and S-register 26 is shifted in the same direction each time R-register 16 is shifted. It will require $E - (n + d)$ shifts to left adjust $\hat{C}$ in R-register 16. Note that the output of G-gate 30 is zero throughout this process and the resulting syndrome expression becomes $$S'_i = \sum_{i=n}^{n+d-1} c_{i-d} R(i+B-n-d) \oplus \sum_{i=j+B}^{n-1} (c_i \oplus c_{i-d}) R(i+B-n-d) \oplus \sum_{i=j}^{j+B-1} e_i R(i+B-n-d) \quad (7)$$

In the above equation use has been made of the fact that $R(E+a) = R(a)$ for all values of $a$.

If R-register 16, X-register 32 and S-register 26 are shifted, d more times the $c_{n-1}$ term in R-register 16 is shifted into the $x_{d-1}$ location in X-register 32. G-gate 30 takes on successive values of $_{n-1}, c_{n-2}, \ldots, c_{n-d}$ during this process and the highest order term remaining in the first summation of equation 7 becomes cancelled. Thus after $[E - (n+d)] + d$ or $E - n$ cycles the initial error syndrome $S_I$ becomes a normalized syndrome, $S_O$, which can be expressed as:

$$S_O = \sum_{i=j+B}^{n-1} (c_i \oplus c_{i-d}) R(i+B-n) \oplus \sum_{i=j}^{j+B-1} e_i R(i+B-n) \quad (8)$$

If R-register 16, X-register 32 and S-register 26 are cycled from this state, G-gate 30 outputs on successive cycles are $$[(C_{n-1} \oplus C_{n-d}), (C_{n-2} \oplus C_{n-d-1}), \ldots]$$

these terms will cancel the highest remaining term in the first summation of equation 8. After $n$-$j$-$B$ cycles from the normalized state, the error syndrome will be $$S_{n-j-B} = \sum_{i=j}^{j+B-1} e_i R(i-j) \quad (9)$$

At this point X-register 32 and R-register 16 will contain $$X = \{C_{j+B-1}, C_{j+B-2}, \ldots C_{j+B-d}\}$$

$$R = \{(C_{j+B-1} \oplus e_{j+B-1}), (C_{j+B-2} \oplus e_{j+B-2}), \ldots, (C_j \oplus e_j)\}$$

Thus the next $d$ output states of G-gate 30 will be $G = e_{j+B-1}, e_{j+B-2}, \ldots, e_{j+B-d}$ respectively which will cancel the $d$ high order terms of equation 9. After $n$-$j$-$B$+$d$ cycles from the normalizide state, the error syndrome will be $$S_{n-j-B+d} = \sum_{i=j}^{j+B-d-1} e_i R(i-j+d) \quad (10)$$

$$= \sum_{m=0}^{B+d-1} e_{j+m} R(m+d) \quad (11)$$

Since $0 \leq m+d < n-k$ or all terms in 11., each remainder function, $R(m+d)$ consists of a single "," bit at the $(m+d)$-order position and zeros elsewhere. Thus a correctable syndrome pattern can be recognized by the fact that all $(n$-$k$-$B)$ high order syndrome bits as well as all $d$ low order bits must be identically zero. From the point of detection, the final $j+B-d$ bits of C are reconstructed by modulo 2 adding the output stage of R-register 16 with the $(B-1)$-order term of S-register 26 as the R-register and S-register are successively cycled.

In the case of an asynchronous error burst of length $b \leq B$ with a slip length $d$ where $-D \leq d < 0$, (i.e., $d$-bit deletion) occurring such that the $j$-th order position of $\hat{C}$ is the lowest order position adversely affected, the polynomial representation of $\hat{C}$ is $$\hat{C}(x) = \sum_{i=j+B-d}^{n-d-1} c_{i+d} x^i \oplus \sum_{i=j}^{j+B-d-1} (c_i \oplus e_i) X^i \oplus \sum_{i=0}^{j-1} c_i X^i \quad (12)$$

The error vector, E(X), is given by $$E(x) = \sum_{i=n-d}^{n-1} c_i X^i \oplus \sum_{i=j+B-d}^{n-d-1} (c_i \oplus c_{i+d}) X^i \oplus \sum_{i=j}^{j+B-d-1} e_i X^i \quad (13$$

The initial error syndrome, $S_I$, can be represented as $$S_I = \sum_{i=n-d}^{n-1} c_i R(i) \oplus \sum_{i=j+B-d}^{n-d-1} (c_i \oplus c_{i+d}) R(i) \oplus \sum_{i=j}^{j+B-d-1} e_i R(i) \quad (14$$

If the S-register 26 is cycled an additional B-d times, this will raise the order of the remainder function terms in equation 14, by B-d. Next Ĉ is shifted from its initial right adjusted position in R-register 16 to a left adjusted position. This will require E−n+d shifts with S-register 26 also being cycled with each of these shifts. Thus S-register 26 will have been cycled E−n+B times from the initial syndrome state and the normalized state of the error syndrome will be $$S_0 = \sum_{i=n-d}^{n-1} c_i R(i - n + B) \oplus \sum_{i=j+B-d}^{n-d-1} (c_i \oplus c_{i+d}) R(i - n + B) \oplus \sum_{i=j}^{j+B-d-1} e_i R(i - n - B) \quad (15$$

The same error detection circuitry used for insertion correction can also be used for deletion correction. In this case the normalized state is such that Ĉ is left adjusted in R-register 16 and X-register 32 is cleared. With each shift of X-register 32, R-register 16 and S-register 26, the term from G-gate 30 cancels the highest order syndrome term. After n−j−B cycles the error syndrome becomes $$S_{n-j-B} = \sum_{i=j+B-d}^{j+B-1} (c_i \oplus c_{i+d}) R(i - j) \oplus \sum_{i=j}^{j+B-d-1} e_i R(i - j) \quad (16$$

The highest order remainder function is B−1 and hence a correctable syndrome condition occurs when the high order n−k−B bits of the error syndrome are zero. From the point of detection the final j−B bits of C are reconstructed by modulo 2 adding the output stage of X-register 32 with the (B−1)-order term of S-register 26 as R-register 16, X-register 32, and S-register 26 are successively cycled.

For both the insertion and deletion case, whenever a correctable condition is signalled, the decoded output will be a valid codeword. However, there can be no absolute guarantee that this codeword is the same as the transmitted codeword. There are two types of errors that will cause the decoder to output an erroneous block:

1. The actual error burst exceeded the design capacity of the decoder (i.e., b < B and/or |d| > D), and,
2. The actual error burst was basically correctable but the detection circuitry associated with S-register 26 prematurely signalled a correctable condition prior to arriving at the region of the actual error.

All error correction devices have a limited range of correctability and errors of the first type can never be completely avoided. Errors of the second type are potentially more serious in that not only is the decoded output incorrect but the decoder has signalled the destination device that the decoded output is reliable. Prior to arriving at the region of the actual asynchronous error burst, the syndrome function will contain a very large number of error terms due to the bit slippage as well as the conventional inversion errors. In these cases there is a non-zero probability that all of the syndrome bits being monitored by the detection circuit will be zero and the decoder will prematurely signal a correctable condition and proceed to output the wrong codeword. Prior to locating the true error burst the probability of a zero in any syndrome bit position is ½ and is statistically independent of all other syndrome bit positions. The probability that a particular set of y bits are all zero at any iteration is $2^{-y}$. The detection circuit monitors n−k−B bits for the case of deletions and n−k−B+d bits for the insertion cases. If the decoder must search through an average of n/2 trial positions before finding the actual error burst, the probability that a false correction condition will be found prior to locating the actual error burst is $P_f$ where $$P_f \approx \begin{cases} n \cdot 2^{-(n-k-B+1)} & d < 0 \\ n \cdot 2^{-(n-k-B+d+1)} & d > 0 \end{cases}$$

For the case where a basically uncorrectable block is received having b > B but |d| ≦ D, the probability of false correction is approximately twice this amount. If the slip width d is such that |d| > D, the decoder will recognize that it is unable to correct this error and will not attempt correction. By judicious selection of the decoder parameters n, k, B, and D, the probability of false correction can be kept within acceptable limits.

Reference will now be made to Tables II and III as well as FIG. 2. In Table II, C represents a transmitted codeword having an n bit length equal to 21 and a k information bit length equal to 10 and located in the leading position of transmitted codeword C. Thus the number of parity bits, n−k, equals 11 and are located in the trailing portion of transmitted codeword C. The received data block, Ĉ, has been subjected to a burst error condition, outlined by block 36, in which two bits have been inserted, underlined once and indicated at 38, and one bit has been inverted, underlined twice and indicated at 40. Thus, in the Table II example, n equals 21, n' equals 23, B equals 5, and d equals 2. In addition, j equals 6, it being remembered that the first bit location in the codeword is position zero.

Table III represents the status of R-register 16, S-register 26, S'-register 18 and various control signals at different clock pulses indicated at various line numbers. Table III shows received data block Ĉ, denoted inside of dashed rectangle 42, after Ĉ has been loaded into R-register 16 and S'-register 18. The decoded output block, C*, appears inside of dashed rectangle 44 under column DBIT.

Received data block Ĉ consists of a bit string comprising a plurality of n' bits wherein the most significant bit (MSB) is positioned at the left hand side of the bit string and in block 42 is a "one" and a least significant bit (LSB) positioned at the right hand end of the bit stream which in block 42 is a "zero". The error syndrome is generated as received data block Ĉ is serially loaded into the S'-register and for the example of Ĉ located in block 42 consists of the syndrome listed under S'-register in line 2.1. The syndrome represents a modulo 2 division of the received data block (i.e., the bit string in block 42) by the generating polynomial.

Figure 2:
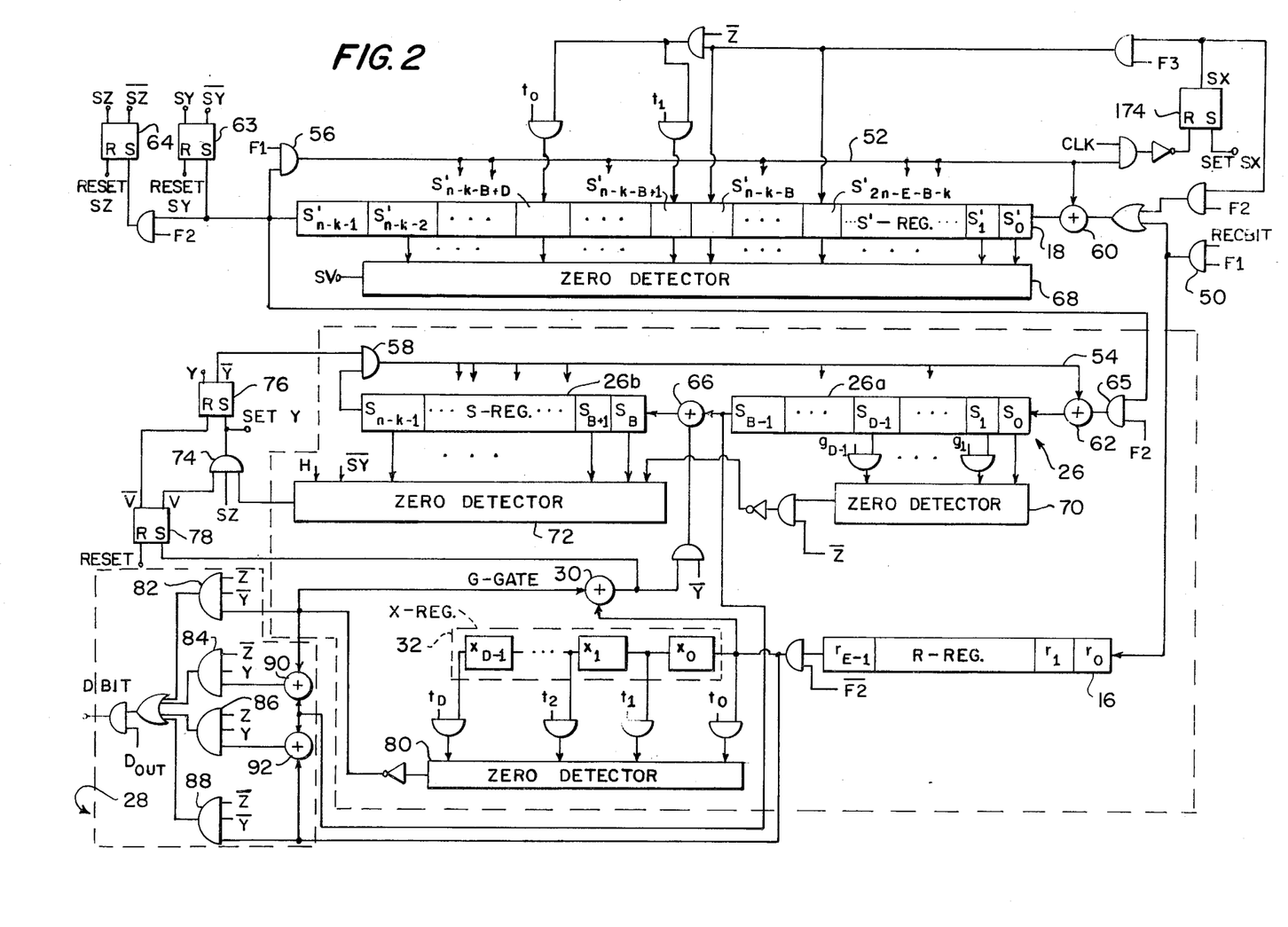
FIG. 2 is a circuit diagram of the main decoder assembly according to a presently preferred embodiment of the invention.

Referring now to FIG. 2, main decoder assembly 35 is shown in greater detail. A received bit from control assembly 12 (RECBIT) is gated in an AND input gate 50 with an input control flag F1, generated by control assembly 12 during the input process, described hereinbelow. From input gate 50 the RECBIT is fed into the S'-register where the error syndrome is generated and temporarily stored and into the R-register 16 where the received data block $\hat{C}$ is temporarily stored. As mentioned above, the S'-register 18, and also the S-register 26, are modified feedback shift registers having $n-k$ stages where parallel input taps are chosen to perform a cyclic block encoding of the received bit stream by the selected generating polynomial. Such circuits are extensively described in standard information theory text such as Robert G. Gallager, *Information Theory and Reliable Communications,* Wiley & Sons, 1968 pp. 224–225. The input taps to both S'-register 18 and S-register 26 are indicated by the plurality of arrows pointing generally downwardly toward the respective register from a feedback line, 52 and 54 respectively. The feedback from the S'-register 18 and S-register 26 is first fed through feedback AND gate 56 and 58, respectively, and then through exclusive OR input gates such as gates 60 and 62, respectively. Feedback gate 56 is gated with signal F1 such that further feedback of the S'-register 18 is inhibited after all of the bits in the received data block $\hat{C}$ have been loaded. The output from the S'-register 18 is also used to set an SY flip-flop 63 and gated with the F2 signal to set and SZ flip-flop 64, and is fed to the S-registers 26 through an input AND gate 65 where it is gated with control signal F2. Control signal F2 is generated by control assembly 12 as an initialization phase flag as described hereinbelow. S-register 26 is also configured such that a bit therein shifted from the $S_{B-1}$ position or location undergoes an exclusive OR operation in an intermediate exclusive OR gate 66 with the output of G-gate 30. Thus, intermediate gate 66 divides S-register 26 into a first part 26a having B stages and a second part 26b having $n-k-B$ stages.

A zero detector 68, that is conventional and well known in the art, is connected to each stage of S'-register 18 and when all stages are zero, with the exception of the $n-k-1$ stage, sets the syndrome flag, SY. A similar type zero detector 70 also monitors the first D stages of S-register 26 (i.e., stages $s_{D-1}$ through $s_0$) with the signals from stages $s_{D-1}$ through $s_1$ being AND gated with corresponding gating vectors $g_i$. When all of the monitored stages of the first part 26a of S-register 26 are zero, zero detector 70 outputs a signal that is gated with Z and sent as an input to a further zero detector 72 which, in addition, monitors for zeros in the stages of the second part 26b of S-register 26. Zero detector 72 also monitors the SY flip-flop 63 and the excessive slip flag H generated by A-counter 14, shown in FIG. 5 and described hereinbelow. When all inputs to zero detector 72 are zero, an output signal is sent to a monitoring AND gate 74 whose output is used to set a Y flip-flop 76. The other inputs to monitoring AND gate 74 include the SZ signal from the SZ flip-flop 64 and a signal from a further flip-flop, the V flip-flop 78. The V flip-flop 78 is in turn set from the output of G-gate 30.

The stages of X-register 32 are also monitored by yet another zero detector 80, each stage being gated with a corresponding gating signal $t_i$, only the appropriate gate being enabled when the $|$slip length$|$ equals the appropriate gate, i.e. $|d| = i$.

A decoded bit is outputed from main decoder assembly 35 via the decoded bit selector 28. Decoder bit selector 28 comprises 4, 3 input AND gates 82, 84, 86 and 88. The outputs from these gates are input to an OR gate whose output is Gated with the DOUT signal generated by control assembly 12. Two exclusive OR gates 90 and 92 complete the logic of decoded bit selector 28. The inputs to the various gates in decoded bit selector 28 include the presence and absence of the correction flag, Y and $\overline{Y}$ that is generated by Y flip-flop 76, the presence and absence of the insertion flag, Z and $\overline{Z}$ from a Z flip-flop 100 (FIG. 5), the output of the R-register 16, the output of the first part 26a of S-register 26, and the output of zero detector 80 which monitors X-register 32.

With reference to FIGS. 3 through 6, a more detailed description of the timing and sequencing assembly circuits necessary to control the main decoder assembly 35 are depicted. With specific reference to FIG. 3, and A'-counter 100 and A"-counter 102 together with respective zero detectors 104 and 106 and a selecting gate assembly enabled by the Y and $\overline{Y}$ flags are used to set the output complete flag F4. A'-counter 100 and A"-counter 102 are $m$ stage counters, where $m$ is the lowest integer is greater than or equal to the $\log_2$ of $(n+D+1)$, and are controlled by two control functions generated by control assembly 12 such that the counters can be initially set and can be jointly decremented by one. A'-counter 100 and A"-counter 102 are used to control the number of decoded bits. Let $p_{m-1}, p_{m-2}, \ldots, p_0$ represent a patched or prewired series of $m$ wires coded with the binary value of $n$. Thus, in the example shown in Table III, $m = 21$, the binary representation of which equals 10101. The numerical binary input to A'-counter 100 is generated by input counter 14.

Figure 4:
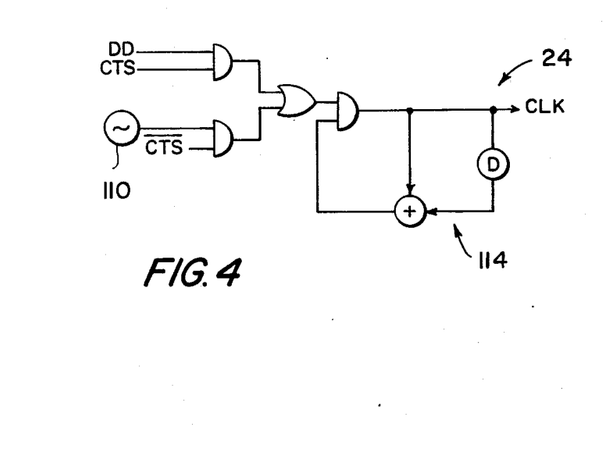
FIG. 4 is a circuit diagram of the clock generating assembly.

FIG. 4 depicts one possible detailed embodiment of clock section 24. Clock section 24 generates the master clock signal CLK as a result of a synthesis of the input clock signal DD obtained from packet framing device 10 (FIG. 1) and an internal square wave oscillator, shown diagramatically at 110. The selection of the particular source of clock pulses is made through a selecting gate assembly 112 which is selectively enabled by the Clear-To-Send signal CTS generated by control assembly 12. If the CTS signal is set, the external clock signal DD is selected, otherwise, the CLK signal will be generated by oscillator 110. A delay assembly diagrammatically shown at 114 is provided to inhibit very short clock pulses which might otherwise occur when the clock sources are switched.

Figure 5:
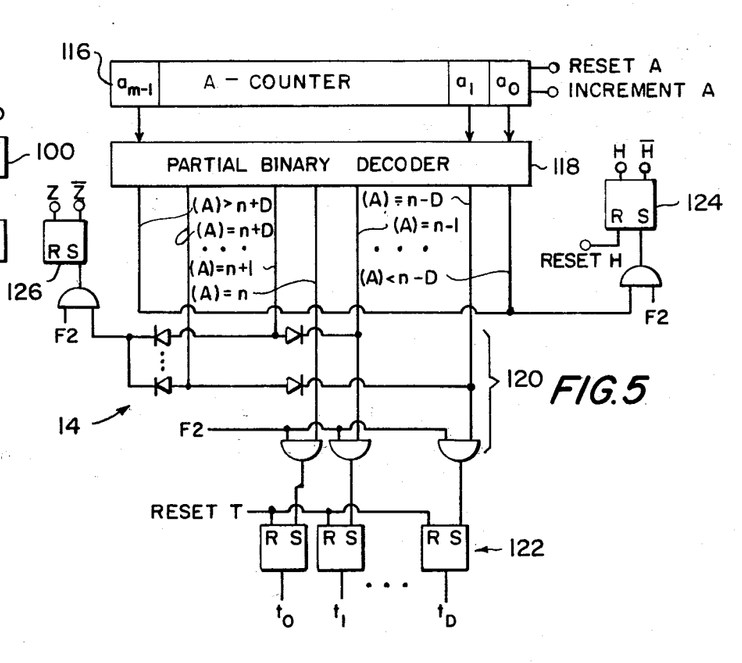
FIG. 5 is a circuit diagram of the input counter assembly of the present invention showing the circuit for counting the number of input flags and the related logic for setting certain flags dependent upon the number of characters in the received data block.

Input counter 14 is depicted in greater detail in FIG. 5 and comprises an A-counter 116, which is also an M-stage counter, a partial binary decoder 118, a decoding section 120 and a plurality of T flip-flops 122 for generating the appropriate gating signal $t_i$ where $i$ equals the absolute value of the slip width. Partial binary decoder 118 decodes only the 2D + 1 states from $n - D$ to $n + D$. Binary decoders are well known to those skilled in the art and are discussed in most texts on the subject. Once such text is Yaohan Chu, *Digital Computer Design Fundamentals,* McGraw Hill, (1962) in Chapter 9, pp. 309–328. A-counter 116 has a reset line and an increment line that are strobed at the appropriate times by control assembly 12. Input counter 14 is also used to set an H flip-flop 124 and a Z flip-flop 126 through selecting gates enabled by initialization phase flag F2. H flip-flop 124 is set and generates the H flag or excessive slip flag when the absolute value of the slip length is greater than D. Z flip-flop 126 is set whenever $n'$ is greater than $n$ but less than $n + D + 1$.

Figure 6:
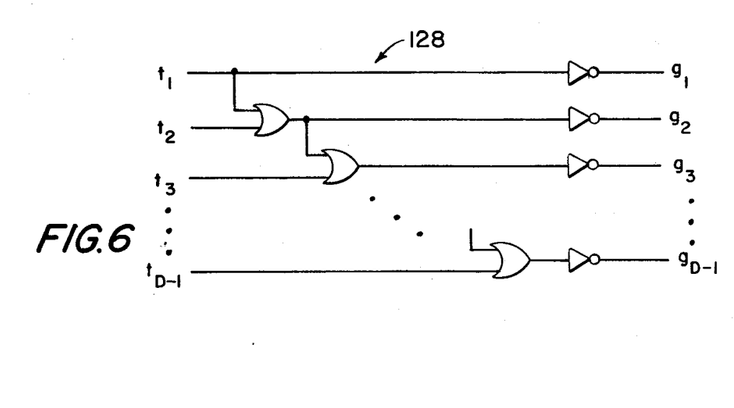
FIG. 6 is a circuit diagram of a logic array used for generating a plurality of control signals dependent upon the detected slip length of the received data block.

The appropriate gating vectors, $g_i$, are generated in a g-array depicted in FIG. 6. The g-array is formed as a result of a plurality of decoding gates 128 that are logically connected such that $g_i = \overline{(t_1 + t_2 + \ldots + t_i)}$.

Figure 7:
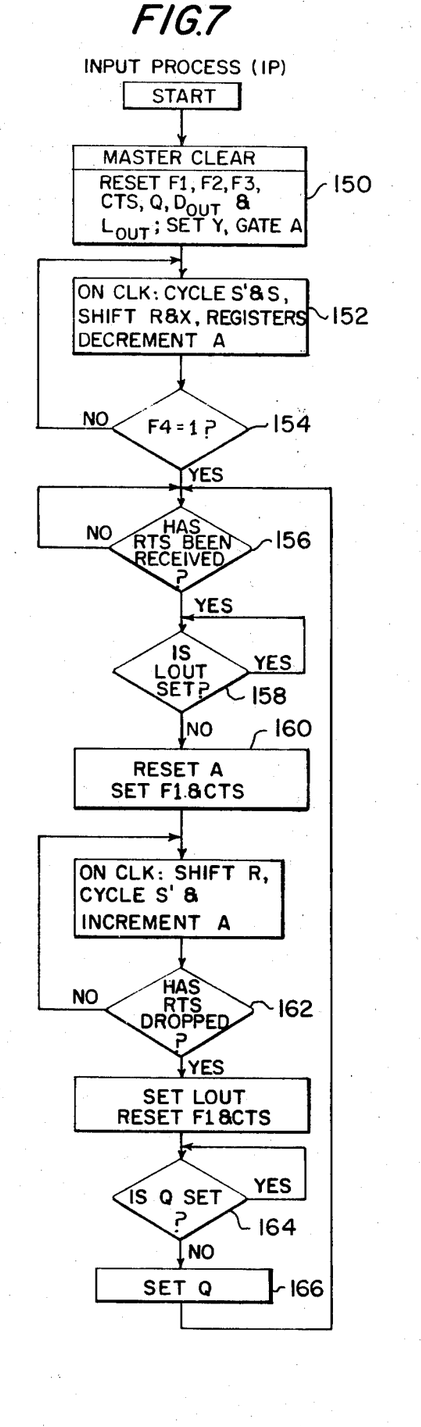
FIG. 7 is a flow chart diagram of the input process stage of a control assembly.
Figure 8:
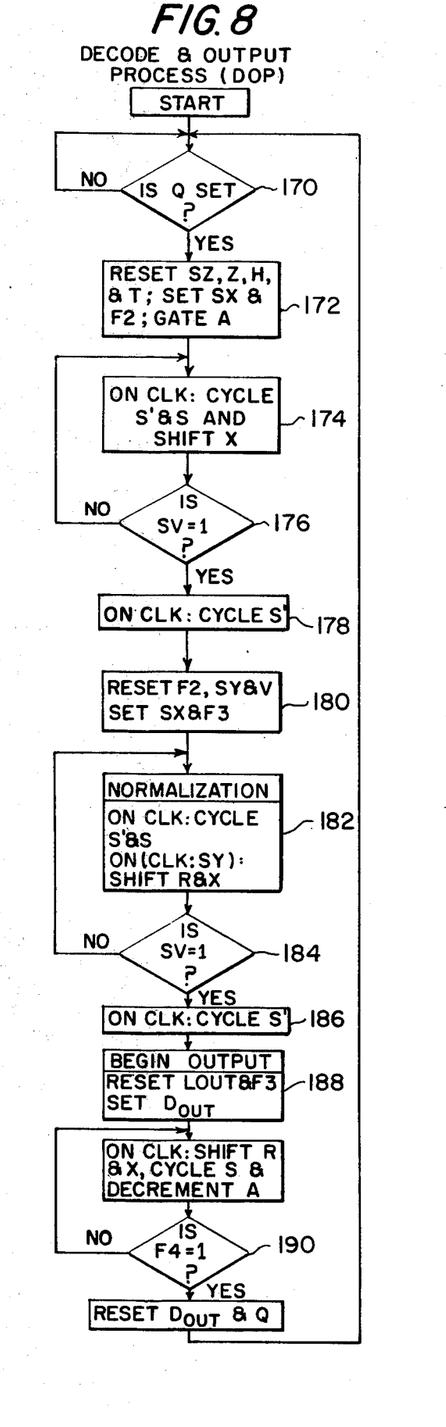
FIG. 8 is a flow chart diagram of the decode and output process stage of the control assembly.

A flow chart diagram of the logic of control assembly 12 is shown in FIGS. 7 and 8. Since the description of the operation of control assembly 12 is integrally combined with the description of the operation of the invention, FIGS. 7 and 8 will be discussed hereinbelow together with a discussion of the operation of the invention.

At the beginning of each session of operations, the Master Clear sequence is activated wherein the control assembly 12 generates a plurality of signals to reset flags F1, F2, F3, to clear the CTS (Clear-To-Send) signal, and to reset the Q flag, DOUT and LOUT signals. In addition, the Y flip-flop is set and the A-gate signal is activated to load A-counter 116 and A'-counter 100. This process is indicated in the Master Clear control block 150 in FIG. 7. In an initialization operation control block 152, the S' and S-registers are cycled, the master clock signal CLK is generated and controlled from square wave oscillator 110 as a result of the absence of a CTS signal, the R and S-registers are shifted and the A-counter is decremented. The initialization operation is carried out until the output complete flag F4, generated by the circuitry in FIG. 3, equals one. The test is carried out in initialization complete decision box 154. Thus, all control flags are reset and the principal decoder registers are cleared.

At this point, the input process IP waits until a Request-To-Send (RTS) signal is received. After an RTS signal has been received, the input process interrogates whether the input inhibit flag, LOUT, has been set. The LOUT flag is set by control assembly 12 to lock out further inputs to main decoder assembly 35 until additional data can be processed as described in further detail hereinbelow. The testing for the RTS flag and the LOUT flag is done in decision boxes 156 and 158 respectively.

As soon as control assembly 12 determines that it is ready to receive data and data is waiting to be sent to it, the A-counter is cleared and the F1 flag and CTS flags are set as indicated in control block 160. This enables external packet framing device 10 to input data to S'-register 18 and to R-register 16. The setting of CTS flag also causes the master clock signal CLK to be generated from external control. On each clock pulse, input data is then clocked bit by bit into the S'-register 18 and R-register 16 until the Request-To-Send (RTS) signal is dropped by packet framing device 10. The dropping of RTS signal is detected in decision box 162. As soon as the RTS signal has been dropped, control assembly 12 sets the LOUT flag and enters the input lock out mode. Further external input is inhibited by resetting of CTS flag and F1 flag. The resetting of the CTS flag switches the decoder to the internal clock. The input process phase of control assembly now enters a wait stage, as indicated by the delay loop in decision box 164 by testing to see if the Q flag has been set, and will remain in this wait mode until the previous block decoding operation has been completed. As soon as the previous block decoder operation has been completed, the decode and output process phase of control assembly 12 will reset the Q flag, the input process will detect the resetting of the Q flag, set the Q flag in control block 166 and then shift to a further wait mode until the next RTS signal has been received as tested in decision box 156.

The setting of the Q flag by the input process phase of control assembly 12 is sensed in the decode and output process phase in decision box 170. The received block, now loaded in R-register 14 is now ready to be processed. The decode and output process immediately initializes the main decoder assembly 35 in an initialization control block 172 by resetting SZ flip-flop 64 (zero syndrome flag), Z flip-flop 126 (insertion flag), H flip-flop 124 (excessive slip flag), and the T flip-flop 122 (gating signal flags indicating the slip width); setting an SX flip-flop 174 (in FIG. 2) which generates a timing control signal, and the initialization phase flag F2; and loading gate A line to load the binary coded value of $n'$ counted by A-counter 116 into A'-counter 100 and loading the binary coded value of $n$ into A"-counter 102. X-register 32, S-register 26, and S'-register 18 are then each cycled $n-k$ times which is determined by testing in decision box 176 whether the SV flag is set. The S'-register 18 is cycled one more time by control block 178 to clear the register and flags F2 (initialization phase flag) and SY flip-flop 63 and V flip-flop 78 are reset and SX flip-flop 174 and the F3 flag (end test flag) are set in control block 180.

At this time, decode output process will normalize R-register 16 and S-register 26 as indicated in normalization control block 182. Under control of S-register 18, the S-register 26 is cycled either $B - d$ times ($Z = 0$) or B times ($Z = 1$) by itself. Then, the X-register 32, R-register 16, and S-register 26 are cycled $E - n + d$ times ($Z = 0$) or $E - n$ times ($Z = 1$). This is determined by the value of the SV flag in decision box 184. The S'-register 18 is cycled one more time in control block 180 to clear the register again and this represents the end of the normalization phase and the input lock out mode is terminated at the beginning of the output phase. If another received data block is ready to be inputted, concurrent input and output processes can proceed from this point.

When the normalization phase is complete, the most significant bit of received data block C is left adjusted in the R-register 16 if $Z = 0$ (i.e. the bit deletion case or the no slip case) or is left adjusted in the X-register 32 at the $S_{d-1}$ location if $Z = 1$ (i.e., a bit insertion case). The error syndrome in the S-register 26 is given by equation 8 or 15 for the two respective cases of bit insertion and bit deletion. The Y flip-flop 76, and hence the Y flag, is set when a correctable syndrome pattern is observed in the output phase. Prior to detecting a correctable syndrome pattern the decoded output bit will have been selected to be $r_{E-1}$ or $x_{d-1}$ for the case of $Z = 0$ and $Z = 1$ respectively. A correctable syndrome condition occurs for the deletion case (i.e., $Z = 0$) when the $n - k - B$ high order syndrome bits are zero and for the insertion case ($Z = 1$) when the $n - k - B$ high order syndrome bits and the lowest order $d$ bits are zero. When either a correctable bit insertion or deletion condition occurs, the Y flag is set causing a change in the decoded bit selection. When $Y = 1$, the $s_{B-1}$ bit is modulo 2 added to $x_{d-1}$ or $r_{E-1}$ to form the output bit for the $Z = 0$ and $Z = 1$ cases respectively. The setting of the Y flag also has the effect of altering the number of decoded output bits from $n'$ to $n$.

The output phase is initiated, as shown in FIG. 8, at control block 188 where the LOUT flag and the F3 flag are reset and the DOUT flag is set. The output phase consists of successively shifting R-register 16 and X-register 32 while cycling the S-register 26 until flag F4 equals one tested in decision box 190. The setting of F4 occurs when the selected counter (A' or A") as shown in FIG. 3 reaches a zero state. The A'-Counter and the A"-Counter were initialized in control box 172 to a binary count of n' and n respectively. At each clock pulse during the output phase the A'- and A"-Counters will be decremented. If at some point within the output cycle a correctable error has been detected, the Y Flip Flop will be set; otherwise Y will remain reset throughout the output phase. If a correctable error has been detected, the A"-Counter will control the setting of F4; otherwise F4 will be controlled by the A'-Counter.

The output phase is terminated, as indicated when decision box 190 indicates that F4 equals one. This occurs after $n'$ cycles if the received data block $\hat{C}$ is uncorrectable or $n$ cycles if the received data block $\hat{C}$ was received correctly or has been corrected within the decode phase. At this point, the output phase is terminated and control box 192 resets DOUT flag and is waiting at decision box 170 for the completion of the next input block.

To clarify the concept and function of the subject invention, a numerical example of the decoding and output processing will be given. Suppose that a shortened (21,10) code is constructed from the Golay (23,12) code having a generating polynomial $P(X) = X^{11} + X^{10} + X^6 + X^5 + X^4 + X^2 + 1$ which belongs to the exponent $E=23$. Let the decoder be configured to correct a maximum error burst length (B) of 5 with a maximum slip length (D) of 2. It can easily be verified that if the 10-bit pattern, 1000000000, is encoded by this generating polynomial, the resulting (21,10) codework, C, is 100000000011110110100. Now let us suppose that the asynchronous error burst shown in Table I has occurred. The burst has a burst length $b$ equal to 5 and contains two insertion errors. It can easily be verified that the initial error syndrome generated as a result of receiving $\hat{C}$ is 10100100100.

As the starting condition for this example let us assume that C has been loaded into the R-register, the error syndrome, 10100100100, has been generated in the S'-register and that the A-counter contains a count of 23 corresponding to the number of bits in $\hat{C}$. Table 2 lists the state of the significant registers and flags during the decoding and output process.

Line 2.1 represents the state of the decoder upon completion of the input process. Line 2.1 represents the decoder state after Step 4–13 of the DOP has been performed. During the next 11 lines (2.3–2.13) the contents of the S'-register is copied into the S-register. The end test for this is controlled by the "1" bit that is forced into $s_0'$ on the first cycle (2.3). This bit came from the SX flag that was set in 4–13 and subsequently reset one cycle later. This end test bit causes SV to become "1" after 11 cycles and the following cycle (4–16 and Line 2.14) clears S'. The normalization process is initialized in 4–17 and Line 2.15. Note that since $Z=1$, the normalization control pattern gated into S' represents 00001010000. (Had the decoder been in deletion mode ($Z=0$), the normalization control pattern would have been 001010000.) Since S' is cycled during the normalization phase, a total of 5 cycles will occur before the SY Flag is set and 7 cycles will occur before $SV = 1$.

Thus the next 5 cycles (Lines 2.16–2.20) the S-register is cycled without concurrent R- and X-register shifting. During the final two cycles (Line 2.21–2.22), the X- and R-registers are also shifted. The S'-register is cleared on Line 2.23 and is not used during the remainder of the decoding cycle.

The output phase extends from Line 2.24 to 2.44. Initially the selected output bit (DBIT) represent $x_1$ from the preceding cycle. Also note that in addition to the normal cycling of the S-register a "1" bit is modulo 2 added to $s_5$ whenever the G bit is "1" on the preceding cycle where $G = x_1 + r_{22}$. This additional syndrome modification process occurs on Line 2.21, 2.24, 2.32, 2.33, and 2.34. A correctable syndrome is detected on Line 2.35 when the high order 6 bits (n-k-B=6) are zeros and the low order 2 bits ($d=2$) are also zeros. At this point Y is set. For the remaining 9 bits of the block (Line 2.36 – 2.44) the output bit is selected to be $r_{22} + s_4$ from the preceding cycle. Note that the A'-counter had been controlling the output bit count until Y became set; thereafter the A"-counter became the controlling counter thus resulting in a 21 bit output. The correct codeword output from the decoder is shown in the DBIT column.

Despite the advantages gained by FIFO decoding (i.e., non-reversal of decoded bits, minimized decoder delays, shared input/output storage register, and concurrent input/output operations), there may be times when its use is impractical. Such a condition might occur if the code's generating polynomial belonged to an exponent $E \gg n + D$. In that case the necessity of normalizing the received block from an initially right adjusted position in an E-stage shift register to a left-adjusted position might require an excessive number of shifts. Ideally a generating polynomial would be chosen such that $E = n + D$, but where the generating polynomial has been externally specified such that $E \gg n + D$, then the preferred embodiment may not be suitable. In such cases an alternate embodiment consists of decoding the block in LIFO manner. The technique consists of successively iterating the error syndrome to lower order positions and detecting a correctable error when all of the selected bits of the syndrome register are zero. The slip detection circuitry is configured in a mirror-image of that shown in FIG. 5. In this case the G-gate output consists of $r_0 + x_{d-1}$ where now the X-register is the low order extension of the R-register. The decoded bit selection circuitry is essentially identical to the preferred embodiment case.

The aforedescribed embodiment of the invention has been described with respect to feedback shift registers and other specific hardware. However, as is well known in the art, the present invention can also be practiced by a specifically programmed general purpose digital computer. Thus, the particular apparatus and method of storing, the processing, and retrieving information from the registers is not critical to the performance of the present invention. It is only necessary that the data be operated on serially pursuant to the method and with the apparatus hereindescribed. Thus, for example, the described feedback shift register can be duplicated functionally by a programmed general purpose digital computer having a memory means for storing the bits and a central processing unit for operating on the stored data in the same manner as that described with respect to the feedback shift registers in the present invention.

In addition, although the present invention has been described with respect to data that has been transmitted by a communication system, for example, data transmitted by a deep space probe or a spacecraft that has landed on another planet, the present invention should not be so limited. Thus, for example, data stored in memory can also be subjected to a noisy environment wherein the data can be subjected to error bursts similar to that of the transmitted data. Similarly, data which has been stored in a memory of a computer system can be subjected to error bursts when it is being retrieved from that memory.

Although the invention has been described in detail with respect to exemplary embodiments thereof, it will be understood by those of ordinary skill in the art that variations and modifications may be effected within the scope and spirit of the invention.

APPENDIX

Descriptive Line Guide to Table 3

| Table 3 Line Number | Function | IP and DOP Cross Reference |
|---|---|---|
| 2.1 | Decoder state at start of DOP | 170 |
| 2.2 | Initialize DOP control state | 172 |
| 2.3 | Force "1" bit into s' for ent test control by means of SX flip flop 35. Also transfer most significant bit of S' Register into S Register | 174 |
| 2.4-2.12 | Successive transfers of syndrome bits from S' Register to S Register | 176 |
| 2.13 | Final syndrome bit transfer to S-Register. Step terminated due to zero condition in least significant n-k-l bits of S' Register resulting in assertion of SV. | 176 |
| 2.14 | Clear S' Register | 178 |
| 2.15 | Initialization for normalization step | 180 |
| 2.16 | First cycle of syndrome normalization. Note: the end test pattern 00001010000 is formed by modulo 2 adding '1' bits at the $s'_{n-k-B}$ (or $s'_6$) position and at the $s'_{2n-E-B-k}$ or ($s'_4$) position to the previously cleared S' Register | 182 |
| 2.17-2.20 | Next four cycles of syndrome normalization | 182 |
| 2.20 | SY flip flop 63 is set due to the presence of "1" bit in $s'_{10}$ so that subsequent normalization cycles shift the R Register and X Register as well as the S' Register and S Register | 182 |
| 2.21-2.22 | Final two cycles of normalization step. Step terminated when SV flip flop is set signifying that least significant n-k-l bits of S' Register are zero. | 184 |
| 2.23 | Clear S' Register | 186 |
| 2.24 | Output step initialization | 188 |
| 2.24-2.35 | Generation and output of first twelve decoded bits. Gate 82 in decoded bit selector 28 is the bit selector gate responsible for this output. A correctable error pattern is not found until line 2.35 at which time the two least significant bits and the six most significant bits of S Register are zero. | |
| 2.36-2.44 | Generation and output of final nine decoded bits. Gate 84 of decoded bit selector 28 is enabled and controls the subsequent bit selection as a result of a change in the state of Y flip flop 76. | |
| 2.44 | Block output terminated when A" Counter reaches zero causing Flag F4 to be set. | 190 |

I claim:

1. In a machine implemented process for use in a data communications system having decoding apparatus for decoding on a first-in-first-out basis $n'$ received data characters encoded in a shortened cyclic block code of the type $(n,k)$, $n$ being the total number of characters and $k$ being the number of information characters, by the use of a generating polynomial having an exponent E, the received data characters having been subjected to an error inducing environment such that the data can contain a burst error of $b$ characters having a slip error of $d$ characters, the process comprising the steps of:
 1. determining the slip error $d$ of the received characters;
 2. storing the received $n'$ characters in a first register means;
 3. generating and storing an initial syndrome in a second register means, said initial syndrome being computed using the generating polynomial and the received data characters;
 4. generating an intermediate syndrome from said generated initial syndrome by rotating and feeding back pursuant to the syndrome generating polynomial the characters stored in said second register means;
 5. selectively combining parts of the received $n'$ characters stored in said first register means with selected characters of said generated intermediate syndrome to generate further characters; and
 6. testing said generated further characters to determine if said received data characters have undergone a burst error.

2. A machine implemented as claimed in claim 1 where the process also outputs decoded data characters, the process further comprising the additional steps of:
 7. combining in decoded character selection means selected characters from said first register means with a selected character from said second register means for generating a decoded output character; and
 8. repeating steps 5 through 7 for each decoded character until an entire n character codeword has been decoded and outputted.

3. A machine implemented process as claimed in claim 1 wherein the slip error $d$ is determined by counting the number $n'$ of received data characters in counter means and comparing the count in said counter means with the number $n$ of encoded data character.

4. A machine implemented process as claimed in claim 3 and further comprising testing $d \leq D$, where D is a maximum preselected slip error, and outputting an excessive slip signal if $|d| > D$.

5. A machine implemented process as claimed in claim 4 wherein said first register means comprises a shift register and said excessive slip is outputted, said process further comprising shifting said shift register $n'$ times and serially outputting the contents of said shift register, said contents being the same as the received data word.

6. A machine implemented process as claimed in claim 1 wherein said first register means comprises a serial input, serial output shift register having E stages and wherein said second register means comprises a first syndrome register having $n-k$ stages and wherein said received $n'$ characters are serially loaded into said first register and wherein said initial syndrome is computed by serially loading the received data characters into said first syndrome concurrently with said loading of said shift register.

7. A machine implemented process as claimed in claim 6 wherein said second register means further comprises a second syndrome register serially connected to said first syndrome register, said process further including the step of transferring said generated initial syndrome from said first syndrome register to said second syndrome register and wherein said intermediate syndrome is generated in said second syndrome register by shifting said second syndrome register E−n' number of times.

8. A machine implemented process as claimed in claim 7 and further comprising determining whether the slip error $d$ is a slip insertion wherein $n' > n$ or whether the slip error $d$ is a slip deletion wherein $n' < n$, and generating a first signal for a slip insertion and a second signal for a slip deletion and wherein said combined parts are stored in said shift register and comprise two characters spaced $d$ stages apart, and said selective combination of said parts comprises modulo two adding said two characters and shifting said shift register once, then performing said testing step which comprises testing said further characters for a selected zero condition; and repeating said adding, shifting and testing steps until said zero condition is generated.

9. A machine implemented method for detecting slippage errors in shortened cyclic block data of the type $(n,k)$ where n is the correct bit length of a bit string and $k$ is the number of information bits in the bit string, the data encoded by a generating polynomial and subjected to error causing signals that can affect a bit string portion of b bits where $b \leq B \leq n-k$, said method comprising the steps of:
   1. entering a first bit string comprising a plurality of $n'$ bits into an R-register and determining the value of $n'$, where $n' = n \pm d$ bits and $d$ is the slippage error and represents the number of bits inserted or deleted from the correct bit string, and wherein said bit string has a most significant bit (MSB) position at one end and a least significant bit (LSB) position at the other end;
   2. generating and storing an error syndrome comprising a second bit string in an S-register having a most significant bit (MSB) position at one end thereof and a least significant bit (LSB) position at the other end thereof, and syndrome representing a modulo 2 division of the modulo 2 product of said first bit string and the binary representation of the number $2^B$ by the generating polynomial, where B is a predetermined integer number representing the maximum burst length;
   3. comparing the value of $n'$ with the value of $n$ and generating a first signal when $n' > n$ which represents a bit insertion case and generating a second signal when $n' < n$ which represents a bit deletion case;
   4a. testing if said first signal has been generated and if true, then modulo 2 adding the bit in a first bit position corresponding to the location in said R-register of said MSB position of said bit string where said first bit string is initially located with the bit in a second bit position corresponding to the location in said R-register that is spaced d bit positions from said first bit position in the direction of said LSB position of said bit string;
   4b. testing if said second signal has been generated and if true, then selecting the bit in said first bit position unless d selections have been previously made, then modulo two adding the bit presently in said first bit position with the bit that was in said first bit position d number of times previously;
   5. modulo two adding the result of said addition or selection with the bit that is in the bit position corresponding to the location in said S-register that is spaced B bit positions from said LSB position of said S-register;
   6. shifting said first and second bit strings one bit position in said R-register and S-register, respectively, in the direction of the corresponding MSB position, the bit in the S-register bit location corresponding to the bit position spaced B + 1 bit positions from the LSB position of said second bit string with the sum of said modulo two addition of step 5; and if the bit in the MSB position of said second bit string is a 1 immediately prior to said shifting of said second bit string, then modulo 2 adding the binary representation of the generating polynomial to said shifted second bit string subsequent to the shifting of said second bit string and if the bit in the MSB of said second bit string is a 0 immediately prior to said shifting of said second bit string, then adding a zero as the LSB position of second bit string;
   7. conducting a zero condition test to determine if a correctable error condition exists in the entered data by testing if the most significant $n-k-B$ bits of said S-Register are all zeros when said second signal has been generated or by testing if the most significant $n-k-B$ bits of said S-Register are all zeros when said second signal has been generated or by testing if the most significant $n-k-B$ bits and the least significant $d$ bit of said S Register are all zeros when said first signal has been generated;
   8. if no zero condition is determined repeating steps 4a and 5 through 7 if said first signal has been generated and repeating steps 4b and 5 through 7 if said second signal has been generated.

10. A decoder for use in a data communications system for decoding on a first-in-first-out basis $n'$ received data characters encoded in a shortened cyclic block code of the type $(n,k)$, $n$ being the total number of characters and $k$ being the number of information characters, by the use of a generating polynomial having an exponent E, the received data characters having been subjected to an error inducing environment such that the data can contain a burst error of $b$ characters having a slip error of d characters, the decoder comprising:
   means for determining the slip error $d$ of the received characters;
   first register means for storing the received $n'$ characters;
   second register means for generating an initial syndrome that is computed using the generating polynomial and the received data characters, said generating means storing said initial syndrome in said second register means;
   means for generating an intermediate syndrome from said generated initial syndrome by rotating and feeding back pursuant to the syndrome generating polynomial the characters stored in said second register means an E − $n'$ number of times;
   means for selectively combining parts of the received $n'$ characters stored in said first register means with selected characters of said generated intermediate syndrome to generate further characters; and
   means for testing said generated further characters to determine if said received data characters have undergone a burst error.

* * * * *